(12) United States Patent
Adam

(10) Patent No.: US 7,536,660 B2
(45) Date of Patent: May 19, 2009

(54) OPC SIMULATION MODEL USING SOCS DECOMPOSITION OF EDGE FRAGMENTS

(76) Inventor: Konstantinos Adam, 2106 Lyon Ave., Belmont, CA (US) 94002

(*) Notice: Subject to any disclaimer, the term of this patent is extended or adjusted under 35 U.S.C. 154(b) by 201 days.

(21) Appl. No.: 11/062,513

(22) Filed: Jul. 26, 2004

(65) Prior Publication Data

US 2005/0283747 A1    Dec. 22, 2005

Related U.S. Application Data

(60) Provisional application No. 60/547,484, filed on Feb. 25, 2004.

(51) Int. Cl.
*G06F 17/50* (2006.01)
*G06F 9/45* (2006.01)

(52) U.S. Cl. .................... 716/2; 716/5; 716/19

(58) Field of Classification Search .............. 716/11, 716/19–21, 2, 5
See application file for complete search history.

(56) References Cited

U.S. PATENT DOCUMENTS

| | | | |
|---|---|---|---|
| 4,762,396 A | 8/1988 | Dumant et al. |
| 5,502,654 A | 3/1996 | Sawahata |
| 5,655,110 A | 8/1997 | Krivokapic et al. |
| 5,723,233 A | 3/1998 | Garza et al. |
| 5,825,647 A | 10/1998 | Tsudaka |
| 5,879,844 A | 3/1999 | Yamamoto et al. |
| 6,016,357 A | 1/2000 | Neary et al. |
| 6,049,660 A | 4/2000 | Ahn et al. |
| 6,077,310 A | 6/2000 | Yamamoto et al. |
| 6,120,952 A | 9/2000 | Pierrat et al. |
| 6,128,067 A | 10/2000 | Hashimoto |
| 6,187,483 B1 | 2/2001 | Capodieci et al. |
| 6,243,855 B1 | 6/2001 | Kobayashi et al. |
| 6,249,904 B1 | 6/2001 | Cobb |
| 6,263,299 B1 | 7/2001 | Aleshin et al. |
| 6,269,472 B1 | 7/2001 | Garza et al. |
| 6,301,697 B1 | 10/2001 | Cobb |
| 6,317,859 B1 | 11/2001 | Papadopoulou |

(Continued)

FOREIGN PATENT DOCUMENTS

JP        09319067 A        12/1997

(Continued)

OTHER PUBLICATIONS

Mentor Graphics Corporation, News & Views, Mar. 1999, <http://www.mentorg.co.jp/N-V/99_3/dsm.html> [retrieved Nov. 7, 2006].

(Continued)

*Primary Examiner*—Jack Chiang
*Assistant Examiner*—Suresh Memula
(74) *Attorney, Agent, or Firm*—Christensen O'Connor Johnson Kindness PLLC

(57) ABSTRACT

A system for estimating image intensity within a window area of a wafer using a SOCS decomposition to determine the horizontal and vertical edge fragments that correspond to objects within the window area. Results of the decomposition are used to access lookup tables that store data related to the contribution of the edge fragment to the image intensity. Each lookup table stores data that are computed under a different illumination and feature fabrication or placement conditions.

11 Claims, 13 Drawing Sheets

U.S. PATENT DOCUMENTS

| | | | |
|---|---|---|---|
| 6,370,679 B1 | 4/2002 | Chang et al. | |
| 6,425,117 B1 | 7/2002 | Pasch et al. | |
| 6,453,452 B1 | 9/2002 | Chang et al. | |
| 6,453,457 B1 | 9/2002 | Pierrat et al. | |
| 6,467,076 B1 | 10/2002 | Cobb | |
| 6,499,003 B2 | 12/2002 | Jones et al. | |
| 6,665,845 B1 | 12/2003 | Aingaran et al. | |
| 7,017,141 B2 | 3/2006 | Anderson et al. | |
| 7,226,480 B2 | 9/2007 | Adam | |
| 2003/0048458 A1* | 3/2003 | Mieher et al. | 356/601 |
| 2003/0103189 A1* | 6/2003 | Neureuther et al. | 351/176 |
| 2004/0122636 A1 | 6/2004 | Adam | |
| 2005/0015233 A1* | 1/2005 | Gordon | 703/13 |
| 2005/0091014 A1* | 4/2005 | Gallatin et al. | 703/2 |
| 2005/0105180 A1* | 5/2005 | Mackey | 359/500 |
| 2005/0132310 A1* | 6/2005 | Gallatin et al. | 716/4 |
| 2006/0273255 A1* | 12/2006 | Volkov et al. | 250/336.1 |
| 2006/0277520 A1* | 12/2006 | Gennari | 716/21 |
| 2008/0059939 A1* | 3/2008 | Gallatin et al. | 716/20 |

FOREIGN PATENT DOCUMENTS

| | | |
|---|---|---|
| JP | 11-102380 A | 4/1999 |
| JP | 2004-502961 A | 1/2004 |
| WO | WO 99/14637 A1 | 3/1999 |
| WO | WO 01/65315 A2 | 9/2001 |
| WO | WO 01/97096 A1 | 12/2001 |

OTHER PUBLICATIONS

Mentor Graphics Corporation, News & Views, Mar. 1999, <http://www.mentorg.co.jp/N-V/99_3/opc.html> [retrieved Nov. 7, 2006].

Mentor Graphics Corporation, News & Views, Apr. 2000, <http://www.mentorg.co.jp/N-V/00_04/ppower.html> [retrieved Nov. 7, 2006].

Cobb, N., and Y. Granik, "Model-Based OPC Using the MEEF Matrix," *Proceedings of SPIE*, vol. 4889: *22nd Annual BACUS Symposium on Photomask Technology*, Monterey, Calif., Sep. 30-Oct. 4, 2002, p. 147.

Cobb, N., and A. Zakhor, "Experimental Results on Optical Proximity Correction With Variable Threshold Resist Model," *Proceedings of SPIE*, vol. 3051: *Symposium on Optical Microlithography X*, Santa Clara, Calif., Mar. 10-14, 1997, pp. 458-468.

Cobb, N., and A. Zakhor, "Fast, Low-Complexity Mask Design," *Proceedings of SPIE*, vol. 2440: *Symposium on Optical/Laser Microlithography VIII*, Santa Clara, Calif., Feb. 22-24, 1995, pp. 313-327.

Cobb, N., and A. Zakhor, "Fast Sparse Aerial Image Calculation for OPC," *Proceedings of SPIE*, vol. 2621: *15th Annual BACUS Symposium on Photomask Technology and Management*, Santa Clara, Calif., Sep. 20-22, 1995, pp. 534-545.

Cobb, N., and A. Zakhor, "Large Area Phase-Shift Mask Design," *Proceedings of SPIE*, vol. 2197: *Symposium on Optical/Laser Microlithography VII*, San Jose, Calif., Mar. 2-4, 1994, pp. 348-360.

Cobb., N., et al., "Mathematical and CAD Framework for Proximity Correction," *Proceedings of SPIE*, vol. 2726: *Symposium on Optical Microlithography IX*, Santa Clara, Calif., Mar. 13-15, 1996, pp. 208-222.

Cobb, N., and Y. Granik, "Using OPC to Optimize for Image Slope and Improve Process Window," (Nov. 20, 2002), *Proceedings of SPIE*, vol. 5130: *Photomask Japan*, Yokohama, Japan, Apr. 16-18, 2003, p. 42.

Granik, Y., "Generalized MEEF Theory," *Interface 2001*, Nov. 2001.

Granik, Y., and N. Cobb, "MEEF as a Matrix," *Proceedings of SPIE*, vol. 4562: *21st Annual BACUS Symposium on Photomask Technology*, Monterey, Calif., Oct. 2-5, 2001, pp. 980-991.

Granik, Y., and N. Cobb, "Two-Dimensional G-MEEF Theory and Applications," *Proceedings of SPIE*, vol. 4754: *Symposium on Photomask and Next-Generation Lithography Mask Technology IX*, Yokohama, Japan, Apr. 23-25, 2002, pp. 146-155.

Maurer, W., et al., "Process Proximity Correction Using an Automated Software Tool," *Proceedings of SPIE*, vol. 3334: *Optical Microlithography XI*, Santa Clara, Calif., Feb. 22-27, 1998, pp. 245-253.

Maurer, W., et al., "Evaluation of a Fast and Flexible OPC Package: OPTISSIMO," *Proceedings of SPIE*, vol. 2884: *16th Annual Symposium on Photomask Technology and Management*, Redwood City, Calif., Sep. 18-20, 1996, pp. 412-418.

Ohnuma, H., et al., "Lithography Computer Aided Design Technology for Embedded Memory in Logic," *Japanese Journal of Applied Physics* 37(12B):6686-6688, Dec. 1998.

* cited by examiner

*TRUE EMF DIFFRACTED BY THE MASK (3D-REMS)*

SAMPLE SITE
BOX OF RELEVANCE
PLACED OVER EACH DOT

OPC SIMULATION MODEL USING SOCS DECOMPOSITION OF EDGE FRAGMENTS

CROSS REFERENCE TO RELATED APPLICATIONS

The present application is related to U.S. patent application Ser. No. 11/061,765, filed Feb. 17, 2005, and claims the benefit of U.S. Provisional Patent Application No. 60/547,484, filed Feb. 25, 2004, titled CONCEPTS IN OPTICAL AND PROCESS CORRECTION, which is herein incorporated by reference.

FIELD OF THE INVENTION

The present invention relates to photolithography in general and the modeling of layout designs in particular.

BACKGROUND OF THE INVENTION

To produce modern microdevices such as integrated circuits with photolithographic techniques, most photolithographic reticles or masks employ some sort of resolution enhancement technology (RET). Examples of RETs include optical and process correction (OPC, sometimes also called optical proximity correction), phase shifters, subresolution assist features, off-axis illumination and other techniques that, in effect, allow for precompensation of distortions that occur in a lithographic patterning system in order to improve the ability of the system to print a desired pattern of objects on a semiconductor wafer.

To apply these RETs, the effect of these distortions on the actual geometric structures of a microdevice must be predicted. This prediction is usually done using simulation tools that correspond to the various aspects of the imaging and pattern process, including the lithographic imaging, the development and baking of the photoresist, and etching or deposition to form the final device structures. For the application of conventional RETs to semiconductor integrated circuits, the data for each critical layer of an IC is examined using various simulators, and the impact of the distortions assessed. When the resulting features are predicted to be outside of predetermined tolerance ranges, the data defining the layer is altered to compensate for the distortions.

These alterations or corrections are typically carried out at the time the device design undergoes final physical verification. As shown in FIG. 1, a typical design verification and RET process includes receiving a data layout file 45 or portion thereof, that defines a desired pattern of objects to be created on a wafer. This is typically a layer of a device layout in a standard format such as GDS-II, although other formats can also be used. Ultimately, the data in these layers will be used to define the shape of the openings in the photolithographic reticle or mask that will be used in a photolithography system. Consequently, a simulation of the intensity of the projected light from a photomask fabricated from this data at any given point on the wafer is carried out, using an image intensity model 50. From the results of the simulated image intensity, OPC or other RETs 52 are applied to the layout data to compensate for the predicted distortions and improve the resolution and pattern fidelity of the printed objects. A corrected layout file 54, including the applied RETs, is provided to a mask writing tool 56 that produces a number of masks or reticles 58 (hereinafter commonly referred to as a mask) used in the lithographic system to produce the desired devices on wafers.

In a conventional image intensity model, the light passing through various portions of the mask is modeled as a binary process with 100% light transmission occurring in transparent areas 60 on the mask and 0% transmission occurring in opaque areas 62 of the mask. Alternatively, if other types of masks are used such as alternating and attenuating phase-shifting instead of chrome-on-glass (COG), a simplistic model is generally assumed where the mask model is still "binary" but the transmission and phase of the various mask areas receive appropriate values (6% transmission with 180 degree phase for attenuating PSM and 100% transmission with 180 degree phase for alternating PSM).

In fact, phase-shifting masks can have fairly complicated 3-dimensional structures, and are far from "binary". Common phase-shifting structures are created by creating topographic structures in the surface of the mask. These are illustrated in FIG. 2A. The difference in refractive index between the glass mask substrate and air provides a phase shift when apertures of different topography are used. When this phase-shift is 180 degrees, destructive interference occurs between light passing through the two apertures, and the resulting dark interference fringes in the image on the wafer can have highly desirable contrast and depth-of-focus properties.

The topographic patterns on the mask, however, can also have unintended properties. For the phase shifting structure shown in FIG. 2A, the cross section of the mask shows two apertures side by side, one phase shifted and one not. In this case, the phase shift is created by etching into the substrate, although other techniques for mask fabrication by selective deposition are also possible. When the two apertures are of the same width, a "binary" model would predict that the corresponding images should also be identical. However, in fact, additional scattering of light occurs from the edges of the etched apertures. This ultimately reduces the intensity of the light in the image formed from the phase shifted aperture, as shown in FIG. 2B.

Various techniques can be used to compensate for these effects. One is to use a more complicated etch procedure, in which an "undercut" behind the opaque material is formed. This is illustrated in FIG. 2C. This can reduce the imbalance between the two intensities, but it is not eliminated. The mask is still far from being adequately described by a simple "binary" description. The results are exacerbated when these masks with topography are used with off-axis illumination, where the topographic structures may have more dramatic scattering properties than when used at normal incidence.

It is known that applying the simplistic "binary" model of the mask transmission will not accurately describe the images of the mask, and therefore produces errors in the application of RETs to the mask layout. While more sophisticated mask models for computing accurate 3-dimensional electromagnetic fields at photomasks are known, such as the product TEMPEST developed at UC Berkeley and now offered for sale by Panoramic Technologies, they have not been implemented in software for the verification and RET processing of full chip integrated device designs because the models are computationally intensive. Using such a solver for all the millions of feature edges in a typical IC layout would take an impractically long amount of time—days or even weeks. Results are desired in minutes or hours at the longest. Given these problems, there is a need for a system for improving the accuracy of image intensity calculations without significantly increasing processing time.

SUMMARY OF THE INVENTION

To address these and other concerns, the present invention is a method for computing the image intensity within an area of a wafer when using partially coherent illumination of three-dimensional features on a mask.

In one embodiment, the image intensity on a wafer is calculated within an area referred to as a window of relevance. Features or portions thereof that correspond to the window of relevance on the wafer are decomposed into a number of two-dimensional areas and into a number of edges using a Sum Of Coherent Systems (SOCS) algorithm that associates lookup tables that store data related to the contribution to the image intensity from each area and from each edge. Each lookup table contains data that is calculated under different illumination and coherency conditions or mask fabrication parameters. The various lookup tables are addressed and data combined to determine the overall illumination intensity within the window of relevance.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
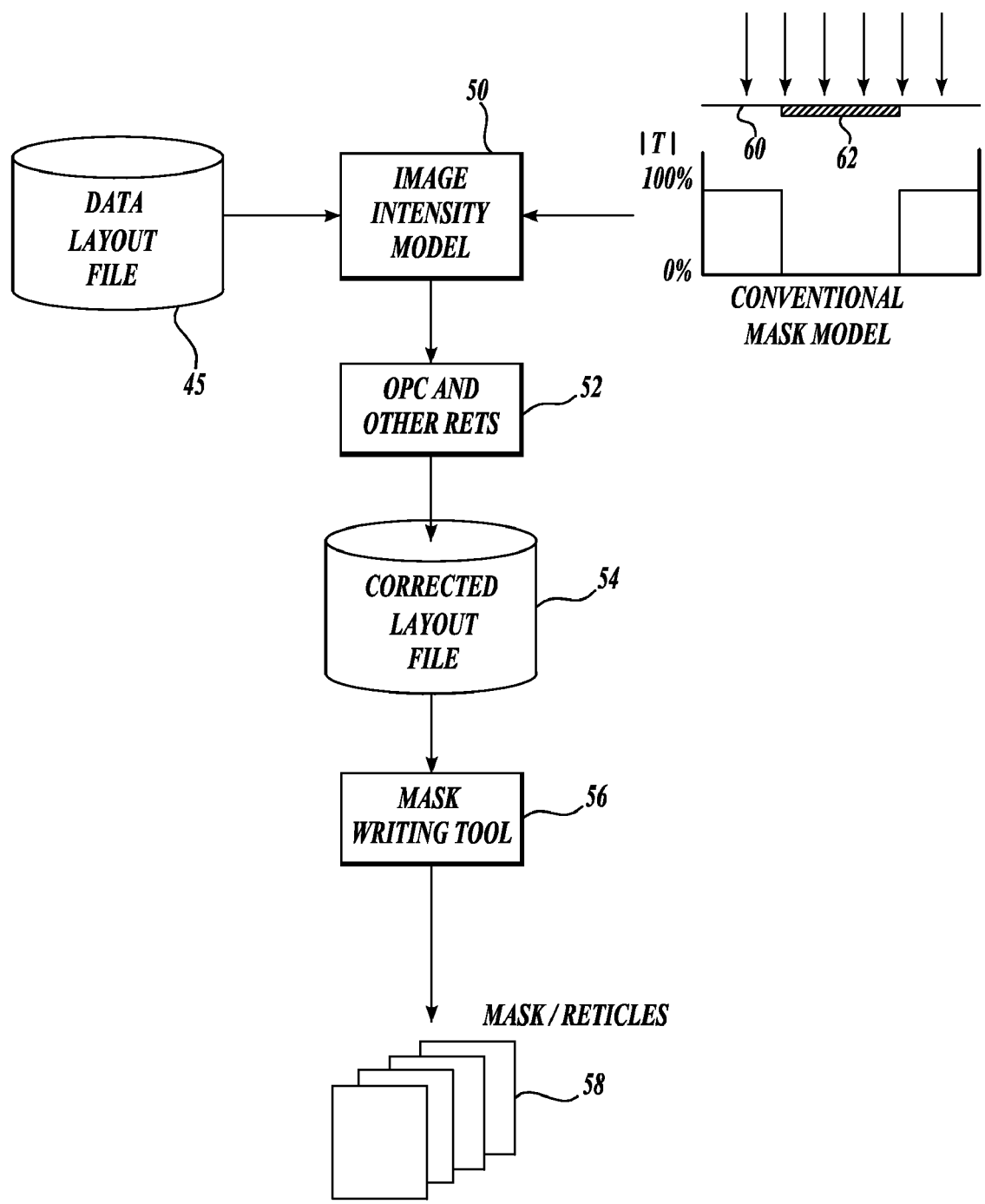
FIG. 1 is a flow diagram of a method of applying RETs to a layout design using a conventional, binary mask model.
Figure 2A:
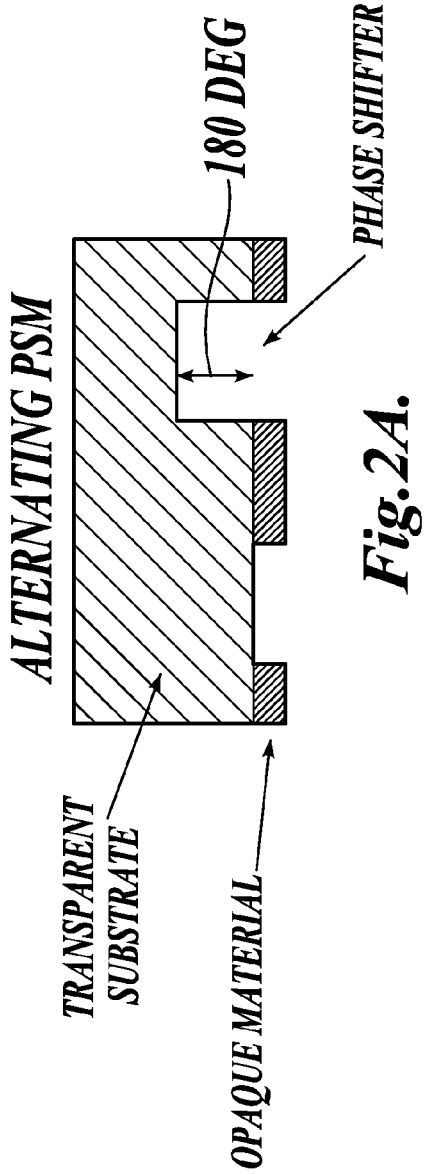
FIGS. 2A-2C illustrate three-dimensional phase shifting features on a mask and the light intensity passing therethrough.
Figure 2B:
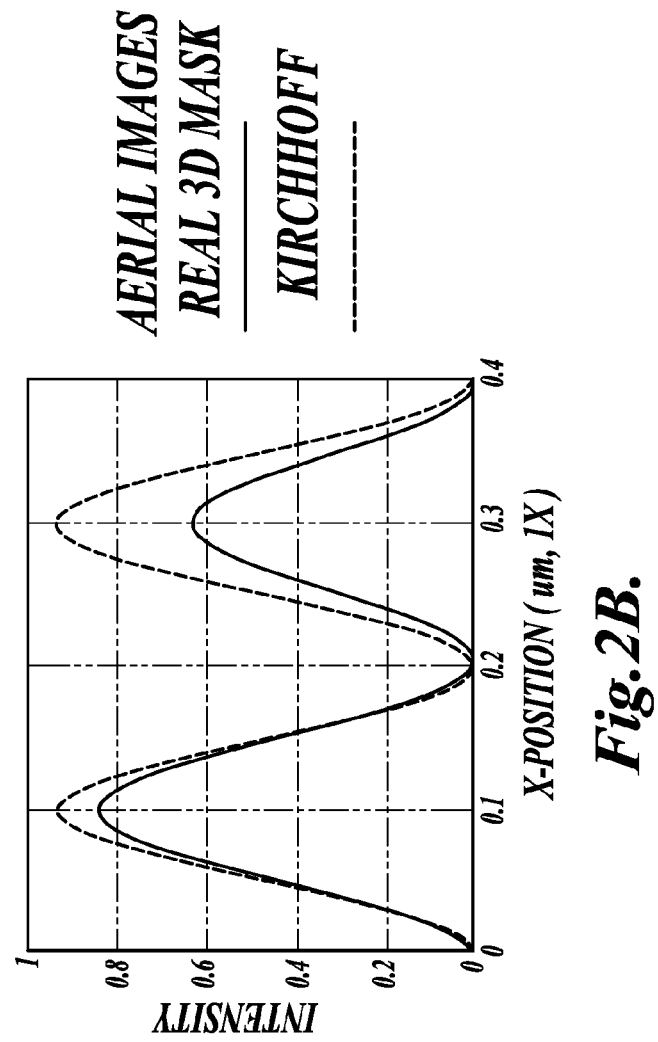
Figure 2C:
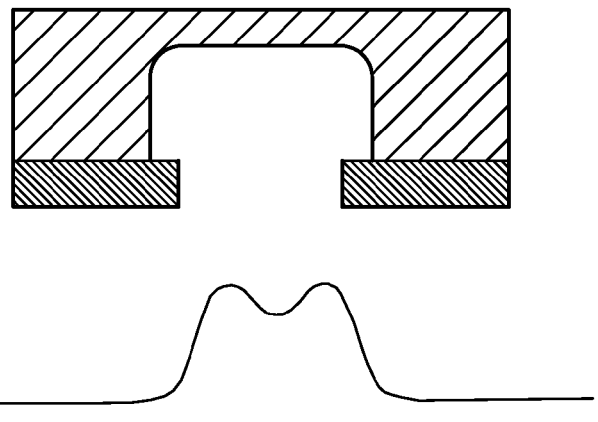
Figure 3:
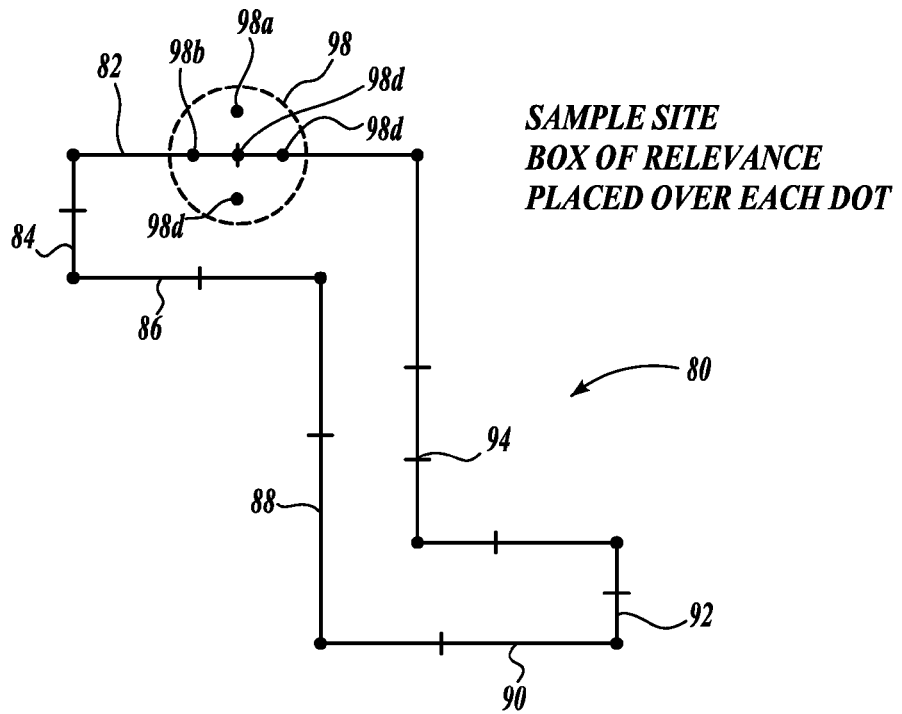
FIG. 3 illustrates a mask feature having a sample site where image intensities are calculated.

As indicated above, the present invention is a system for estimating image intensity at any position on a wafer due to illumination of a mask containing three-dimensional features during photolithographic processing. The invention can be used prior to or during the application of one or more resolution enhancement techniques (RETs) that improve the ability of a photolithographic imaging system to print a desired pattern of objects on a wafer. FIG. 3 illustrates an example of a layout for a three-dimensional mask feature 80 that corresponds to an object to be printed on a wafer. The feature 80 is typically defined in an input layout file as a two dimensional sequence of vertices in a conventional format such as GDS-II or OASIS. The vertices are then further divided into a number of edge segments 82, 84, 86, 88, 90, 92, 94. Each edge segment has one or more sample sites 98 around which the image intensity is calculated for the purpose of deciding if and how one or more resolution enhancement techniques (RETs) should be applied to the edge fragment. The sample site 98 includes a number of sample points 98a, 98b, 98c, 98d, 98e where the estimated image intensity is calculated. To calculate the image intensity, a small area, referred to here as a "window of relevance," is placed over each of the sample points 98a, 98b, etc., and a model is used to estimate the image intensity at that position on the wafer. The window of relevance is typically sized to be at least an optical diameter in width such that features outside the window of relevance do not contribute to the image intensity calculation made within the window of relevance. A typical window of relevance has a size of 2×2 µm.

Figures 4, 5:
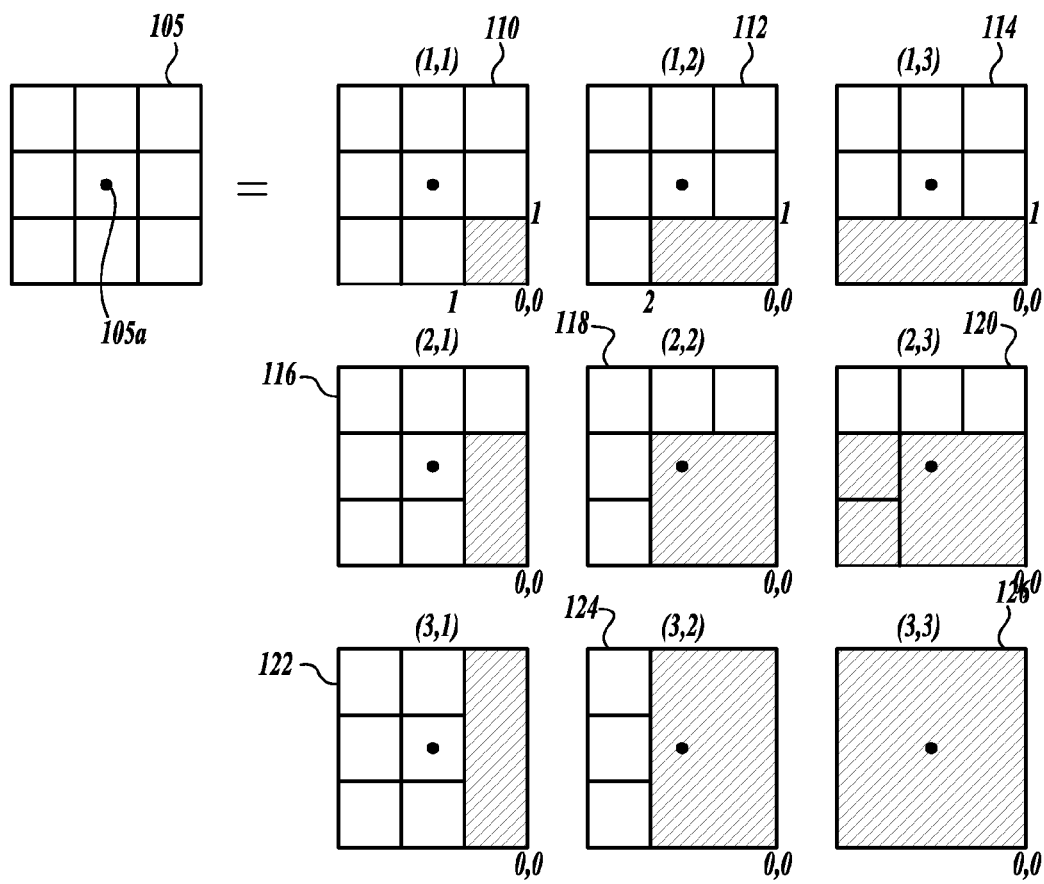
FIG. 4 illustrates a conventional method of decomposing a feature within a window of relevance into a number of areas using the SOCS algorithm.
FIG. 5 illustrates a SOCS lookup table associated with the areas of the window of relevance shown in FIG. 3.

FIG. 4 illustrates a conventional algorithm for estimating the image intensity at a point at the center of a window of relevance. This algorithm generally known as the Sum Of Coherent Systems (SOCS) divides any shape in the window of relevance 105 into a plurality of smaller areas. These areas are also sometimes called "primitives", since they tend to be chosen to represent fundamental building blocks of the shapes used in the layout. SOCS has been described elsewhere, including in the Ph.D. thesis of Nicolas Cobb, "Fast Optical and Process Proximity Correction Algorithms for Integrated Circuit Manufacturing" University of California, Berkeley, Spring, 1998. As is known to those of ordinary skill in the art, the SOCS algorithm decomposes any arbitrary feature shape within the window of relevance 105 into a number of areas that are specified by the location of their non-vertical edges. In the example shown, areas within the window of relevance 105 may be defined with nine horizontal edges 110, 112, 114 . . . 126. However, in practice, the window of relevance may be divided into many more such as $100^2$-$200^2$ areas. Each area defined in the window of relevance may be specified by the location of a horizontal line that is oriented with respect to an origin within the window of relevance. In the example shown, the origin is defined in the lower right hand corner of the window of relevance. For example, an area 110 is defined by a horizontal edge having a height of 1 and a length of 1 in the window of relevance. An area 112 is defined by a horizontal edge having a height of 1 and a length of 2 in the window of relevance, etc. Each of the areas is shown as shaded to illustrate that, in a binary mask model, the illumination light is presumed to be blocked in the area of the window of relevance and fully transmitted outside the area of the window of relevance. Each of the areas 110, 112, 114 . . . 126 is used to estimate the image intensity at a center point 105a in the window of relevance 105.

FIG. 5 illustrates a lookup table 140 associated with the series of areas 110, 112, 114 . . . 126 shown in FIG. 4. Each entry in the lookup table stores a precalculated complex number used to compute the image intensity at the center of the window of relevance. In the conventional SOCS algorithm, the image intensity, i, at any given point x, y, on the wafer is calculated by $$i(x, y) \approx \sum_K i_K(x, y) \quad \text{(Eq. 1)}$$

where $i_K(x, y) = \sigma_K |h_K(x, y) \otimes m(x, y)|^2$ $\sigma_K$ is a weight and $h_K$ is a kernel, and m is the binary mask model discussed above. Equation 1 is also known as a "Kirchhoff decomposition." Because multiple kernels are used in estimating the image intensity, there is a separate lookup table of the type shown in FIG. 4 for each kernel. Each lookup table contains the values of the convolution products $h_k(x,y) \otimes m(x,y)$ for the area shapes. Therefore, to estimate the image intensity within a window of relevance, the SOCS algorithm decomposes a feature in the window of relevance into a number of areas and uses the appropriate lookup tables to complete Equation 1. As discussed above, the Kirchhoff decomposition shown in FIGS. 4 and 5 and described by Equation 1 uses a binary mask model that may produce errors in the application of RETs to a mask.

Figure 6A:
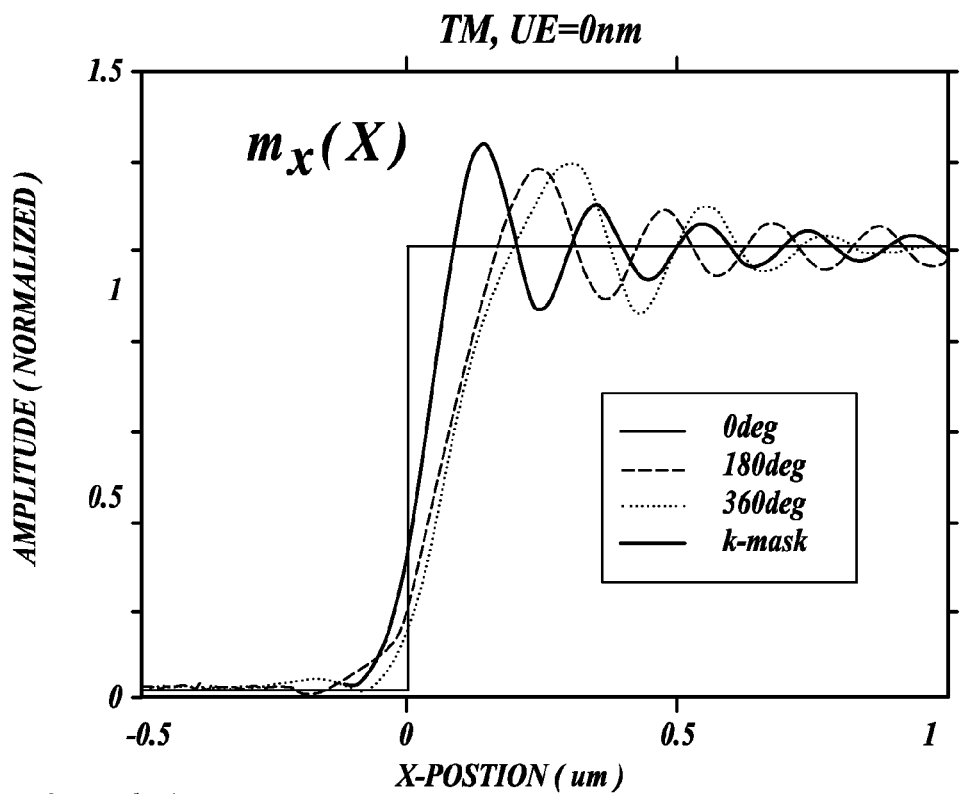
FIGS. 6A-6D illustrate a number of graphs showing scattered electric field (near field) below mask edges of different topographies and under on-axis plane-wave illumination with the electric field parallel or perpendicular to the direction of the edge.

FIG. 6A illustrates simulated scattered electric field values near the edge of a mask feature that are computed with a more sophisticated model versus the results assumed for a binary mask model. The graphs of FIG. 6A are calculated assuming the electric field of the illumination light is parallel to the edge in question and the mask has no undercut portion of the chromium layer. Image intensity calculations are shown for situations where the edge is adjacent a clear area with no phase shift, a phase shifter of 180°, a phase shifter of 360° and a Kirchhoff mask, which is the "binary" model and is contrasted on the plot to show the differences in models.

Figure 6B:
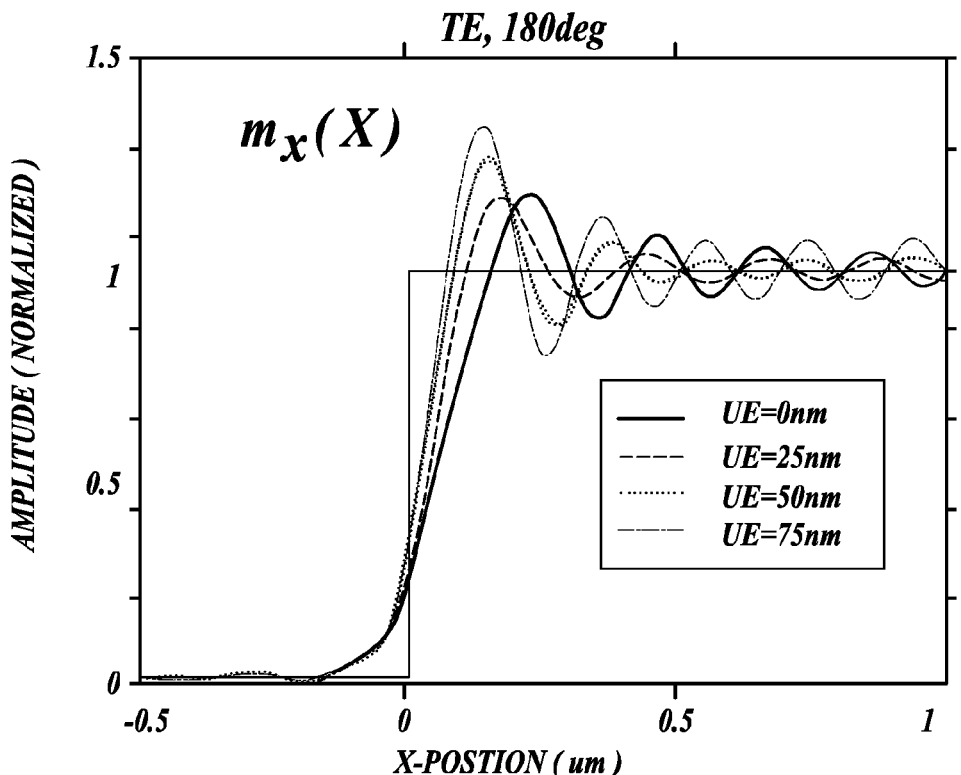

FIG. 6B illustrates simulated scattered electric field values near an edge of a mask feature versus the results assumed for a binary mask model where the electric field of the illumination light is parallel to the edge in question and the edge is adjacent to a 180° phase shifter. Calculations are also shown for undercuts of 0, 25, 50 and 75 nanometers underneath a chromium layer.

Figure 6C:
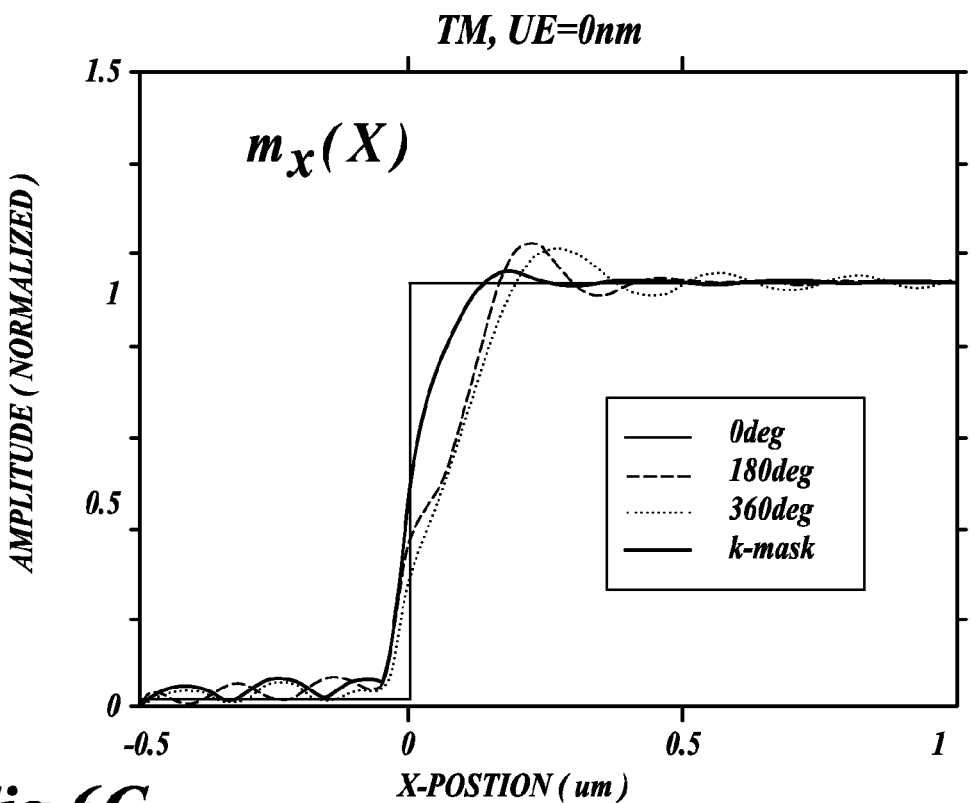
Figure 6D:
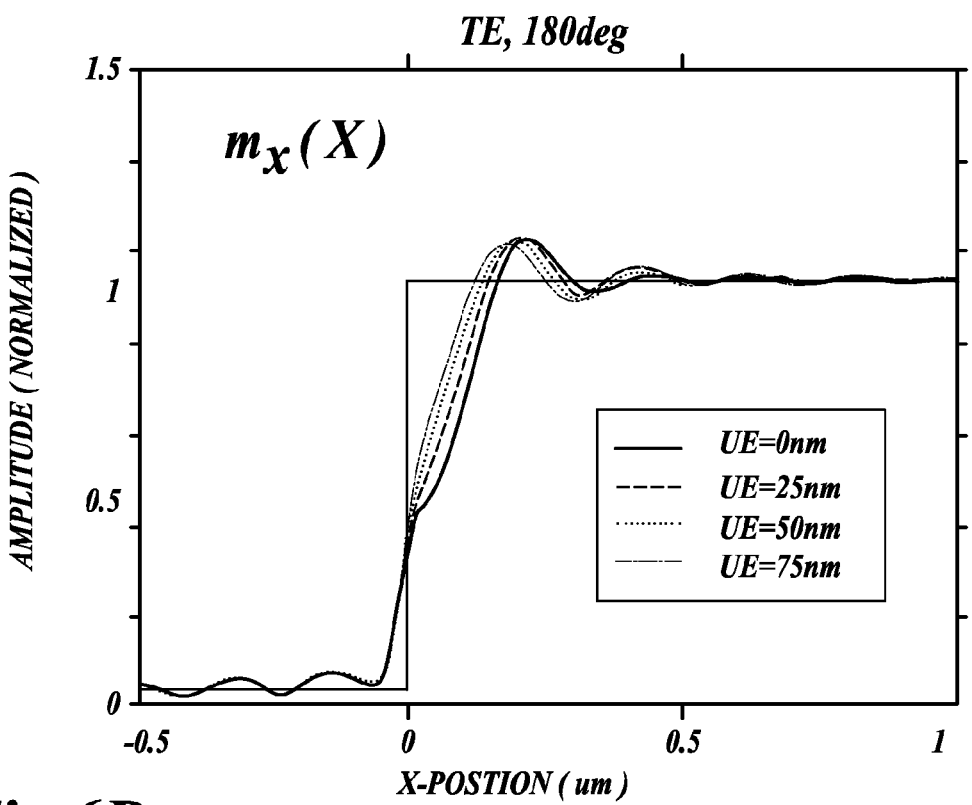
Figure 7A:
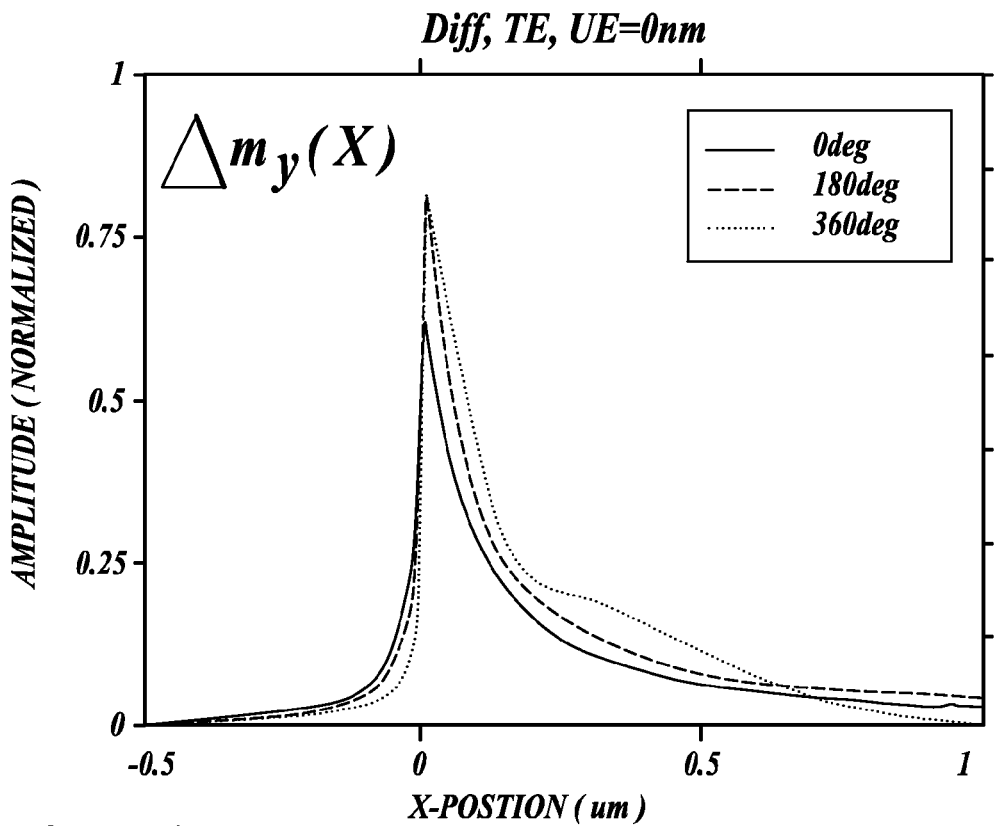
FIGS. 7A-7D illustrate the absolute differences between feature edge near electric fields as shown in FIGS. 6A-6D and those assumed in a conventional binary mask model.
Figure 7B:
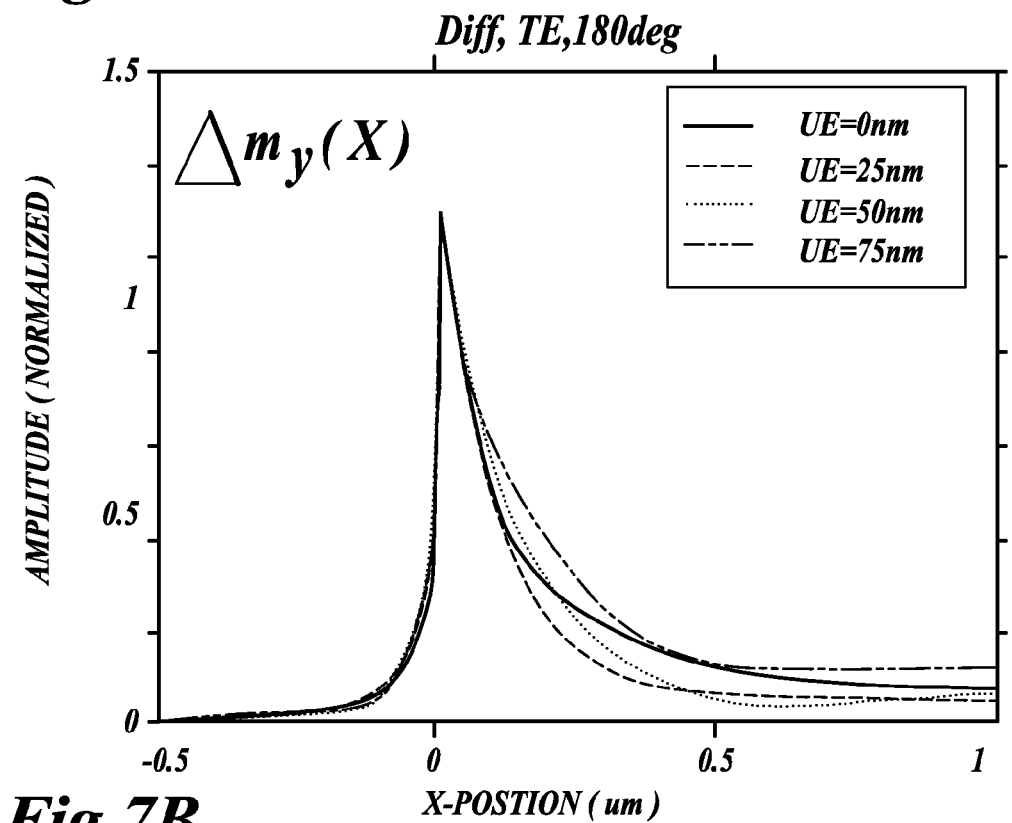
Figure 7C:
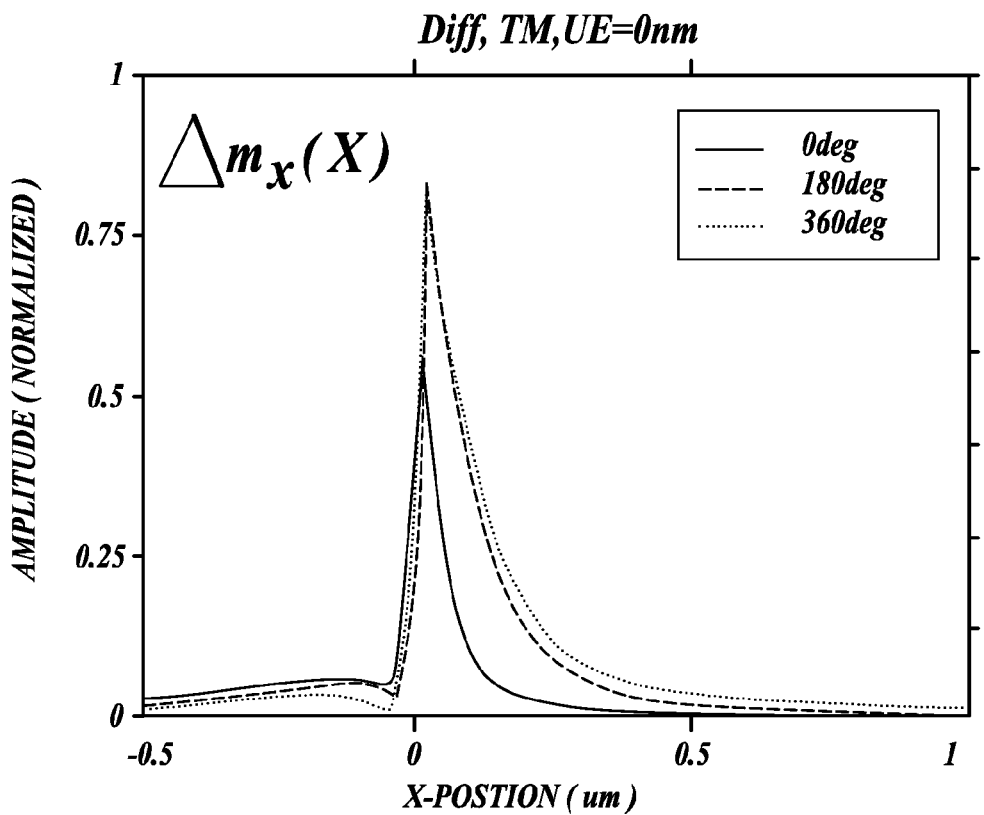
Figure 7D:
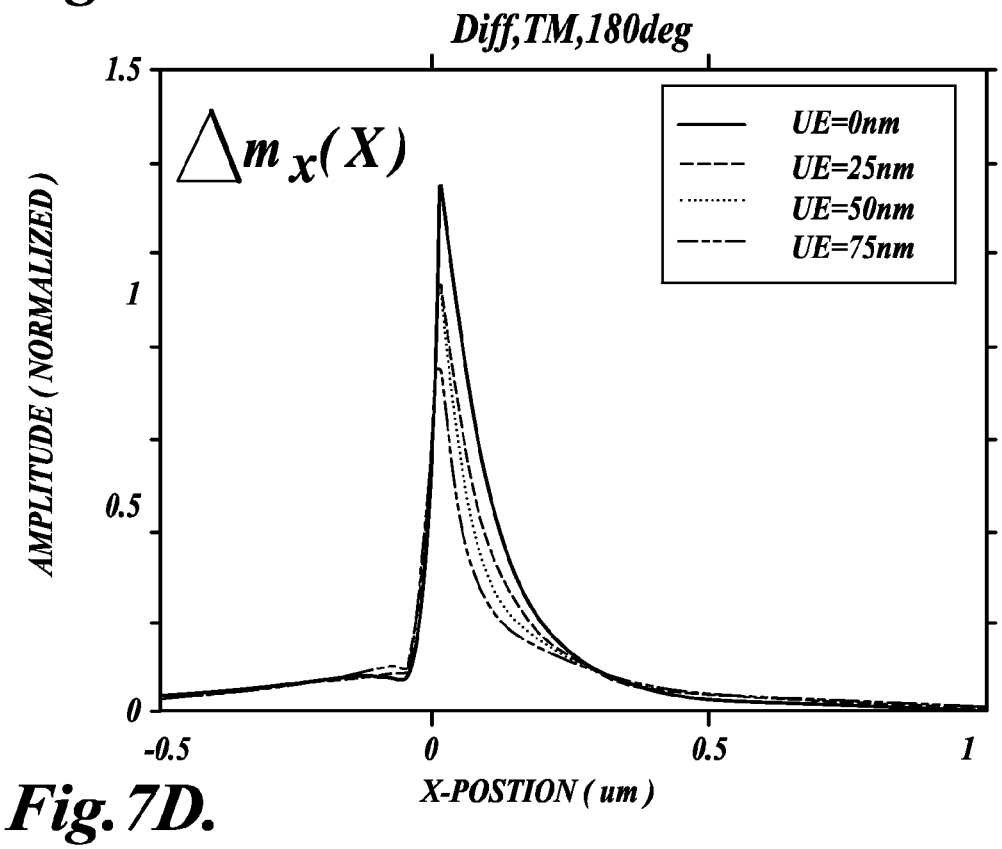

FIG. 6C illustrates simulated scattered electric field versus those assumed for a binary mask model as shown in FIG. 5A but with the electric field perpendicular to the edge in question. Similarly, FIG. 5D illustrates simulated scattered electric field values versus those assumed for a binary mask model as shown in FIG. 5B but with the electric field perpendicular to the edge in question.

FIGS. 7A-7D illustrate the absolute value of the differences between the scattered electric field calculated as shown in FIGS. 5A-5D with the scattered electric field that is assumed when using the binary mask model.

A complete description of the more accurate mask model used to produce the graphs in FIGS. 5A-5D can be found in the Ph.D. thesis "Domain Decomposition Methods for the Electromagnetic Simulation of Scattering from Three-Dimensional Structures with Applications in Lithography" by Konstantinos Adam, University of California, Berkeley, 2001, and U.S. patent application Ser. No. 10/677,136 filed Sep. 20, 2003 by Konstantinos Adam, which are herein incorporated by reference.

Figure 8:
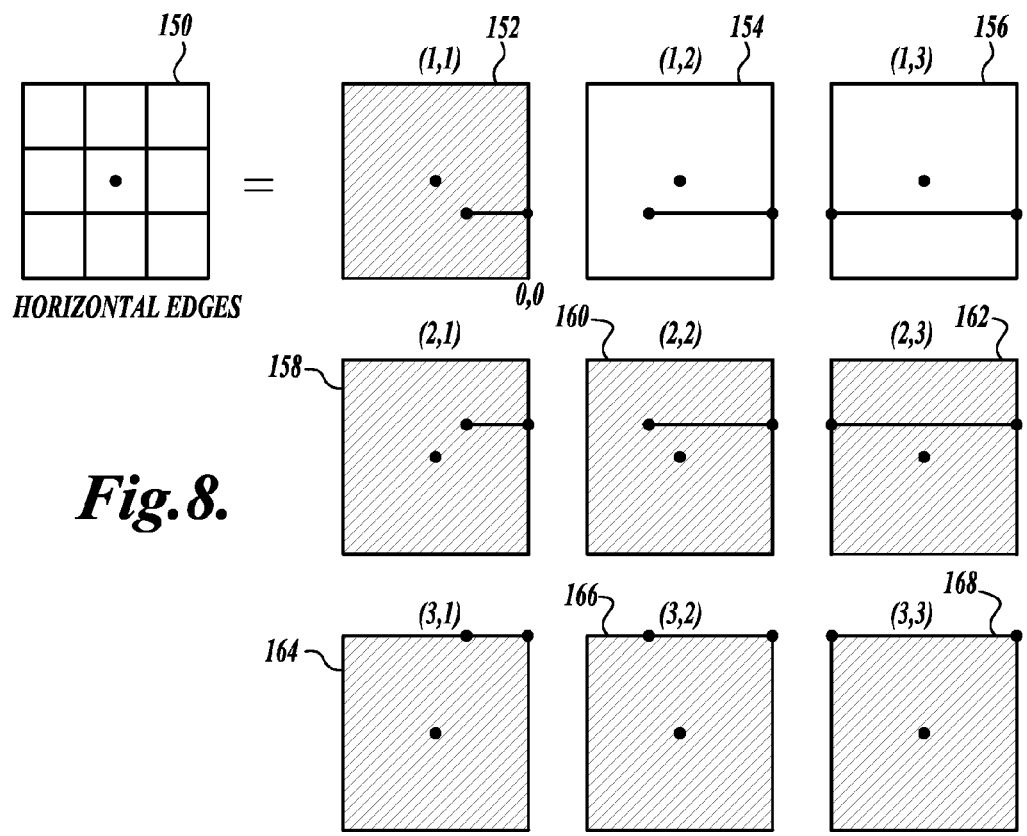
FIG. 8 illustrates a series of horizontal edges within a window of relevance in accordance with one embodiment of the present invention.
Figure 9:
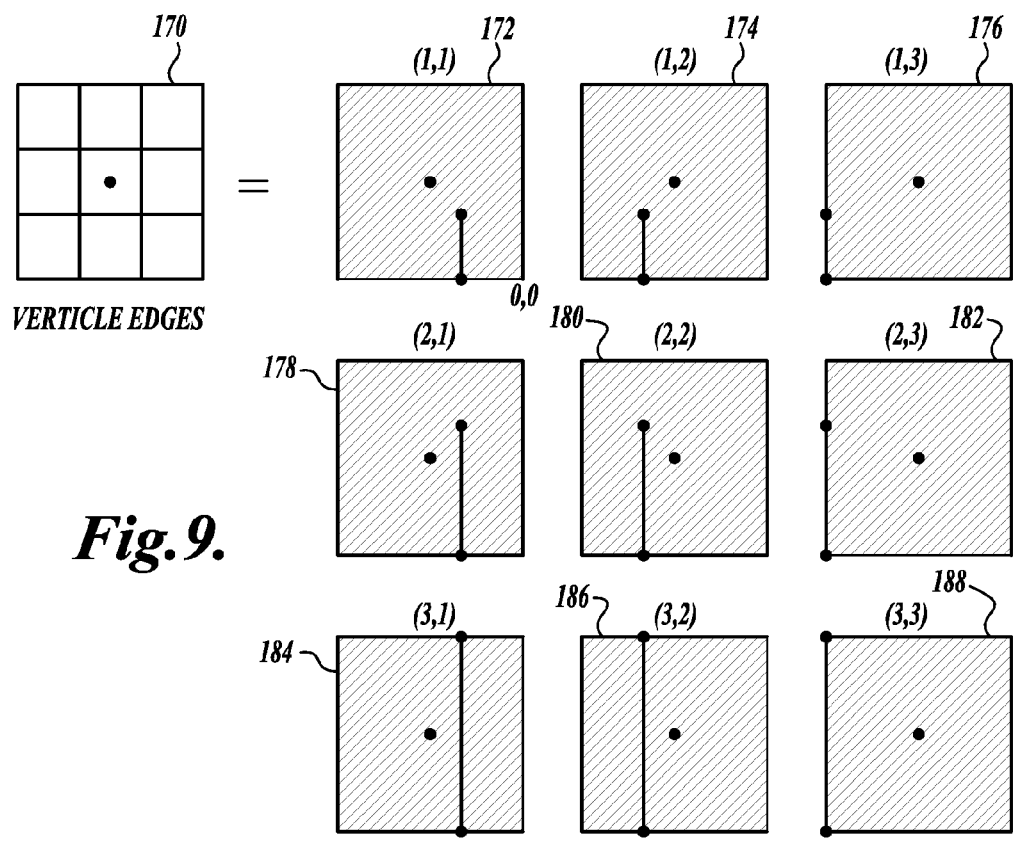
FIG. 9 illustrates a series of vertical edges within a window of relevance in accordance with an embodiment of the present invention.

To better simulate the image intensity on a wafer due to the illumination of a three dimensional object on a mask for the real time use in OPC or other RET enhancement tools, the present invention also considers the effects of the edges of the mask features on the image intensity calculated in the window of relevance. FIG. 8 shows a series of horizontal edges 152, 154, 156 . . . 168 defining the possible position of a horizontal edge in a window of relevance 150 as measured from an origin in the lower right hand corner. FIG. 9 shows a series of vertical edges 172, 174, 176 . . . 188 that define the possible position of vertical edges in a window of relevance 150 as measured from a lower right hand corner.

Figure 10:
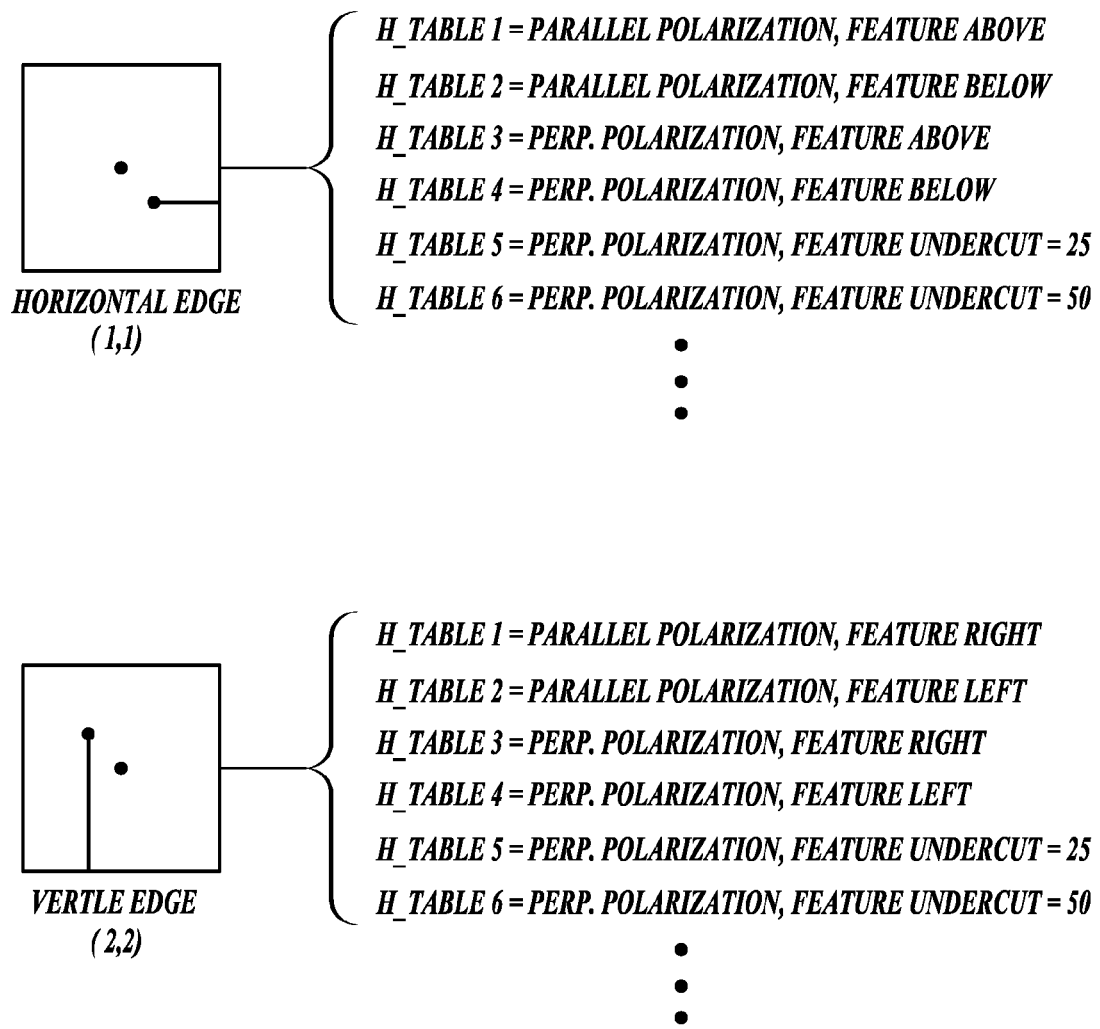
FIG. 10 illustrates how horizontal and vertical edges are associated with a number of lookup tables in accordance with an embodiment of the present invention.

To produce a more accurate estimate of the image intensity at any given point on the wafer, the present invention takes into consideration the effects of the horizontal vertical or diagonally oriented edges of the one or more features in the window of relevance when exposed under different illumination conditions (field polarization and coherency properties). The SOCS algorithm decomposes the one or more features in the window of relevance into a number of areas and into a number of edges that may be vertical, horizontal, diagonal or oriented in some other direction within the window of relevance and uses lookup tables that are pre-calculated for the exposure conditions for each area and edge in order to calculate the overall image intensity. FIG. 10 illustrates a number of lookup tables in which entries are found for the edges that define the possible configurations of horizontal and vertical edges that make up features or portions thereof in a window of relevance. As can be seen, each edge is associated with at least four lookup tables that store precomputed, complex numbers that are used to compute the image intensity within the window of relevance. The values stored in the lookup tables are precomputed using the mask models described in the Adam Ph.D. thesis, referenced above, taking into consideration the polarization of the illumination light and the position of the edge with respect to the feature. For example, calculations are made considering whether its edge is above or below the mask feature for horizontal edges or to the left or the right of the mask feature for vertical edges. In addition, separate lookup tables can be used for other edge parameters such as an amount of undercut or the edge's position next to a phase shifter, etc. Finally, separate lookup tables are required for each kernel to be used in the simulation. Each one of the edges shown in FIG. 8 and FIG. 9 have associated mask transmission functions m(x,y) that are constructed based on the respective signals of the form shown in FIG. 7A-7D—it is understood that the appropriate signal is selected based on the direction of field polarization, the mask fabrication properties and the relative position of the layout geometry.

Figure 11A:
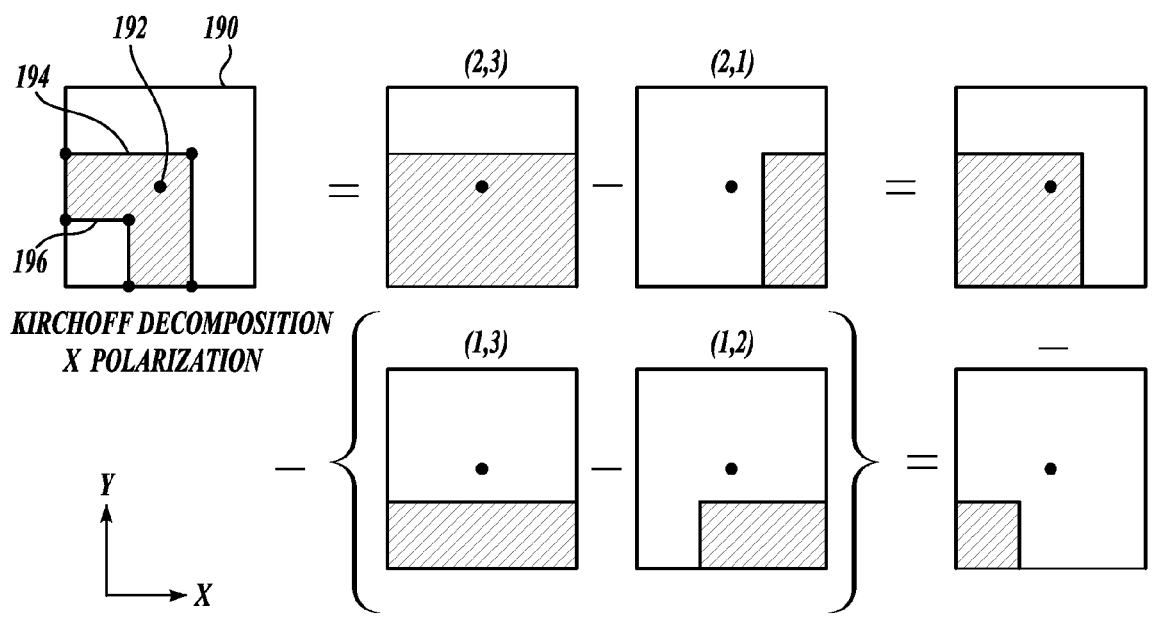
FIGS. 11A-11B illustrate an area and edge decomposition of a feature or portion thereof in a window of relevance in accordance with an embodiment of the present invention.
Figure 11B:
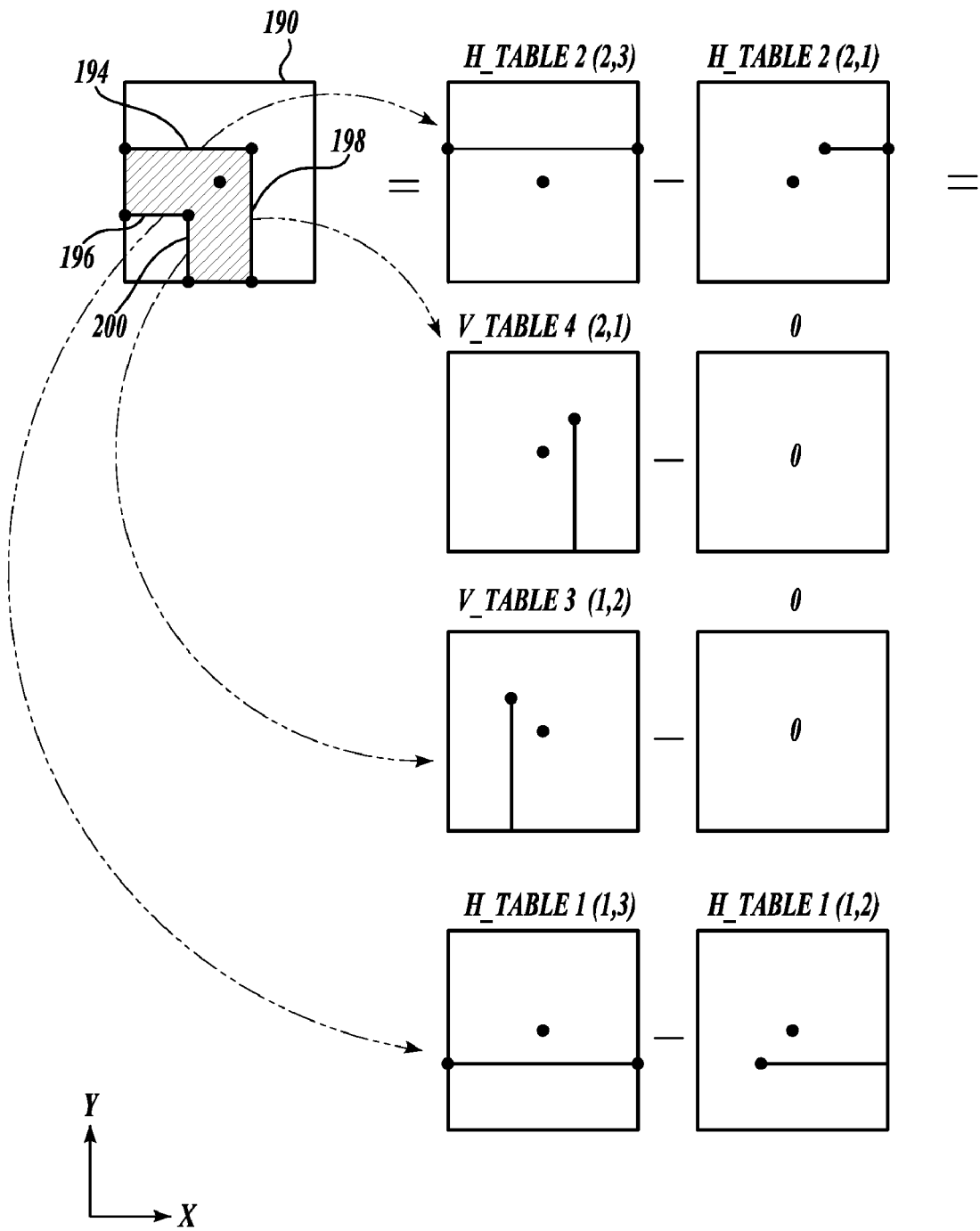

FIGS. 11A and 11B illustrate how any arbitrary feature or portion thereof within a window of relevance is analyzed by the present invention to improve the accuracy with which the image intensity is calculated. To calculate the image intensity, the contribution to the area of the feature(s) is calculated in a similar manner to that described above and shown in FIGS. 4 and 5. That is, a Kirchhoff decomposition is performed to decomposing a shape in a window of relevance into a number of areas defined by the location of the area's horizontal edges within the window of relevance. For example, in the window of relevance 190, a feature 192 has an area that can be defined first horizontal edge 194 and a second horizontal edge 196. Because of the linearity of the SOCS model, the intensity calculation can be divided into parts. Therefore, the image intensity calculations performed for the area of the feature 192 uses the complex values stored in the lookup table for the edge (2,3) minus the values stored for the edge (2,1) (to define the area bounded by the edge 194) less the difference of complex values stored for the edge (1,3) minus the values stored for the edge (1,2) (to define the area bounded by the edge 196).

Unlike the conventional SOCS decomposition, the Kirchhoff model decomposition shown in FIG. 11A is performed using lookup tables that store values calculated assuming that the kernels are derived for polarized light. Two mutually perpendicular directions generally suffice to model unpolarized illumination and in the present embodiment these two are chosen to be the x-direction and the y-direction. However, additional tables could be used assuming other polarizations of light if desired.

In addition to computing the Kirchhoff decomposition as shown in FIG. 11A that accounts for the contribution to the image intensity due the area of the feature(s) within the window of relevance, the present invention also computes the effect that the edges of the feature(s) have on the image intensity. Therefore, the feature(s) in the window of relevance 190 is decomposed into its various horizontal and vertical edges and the appropriate lookup tables are selected according to the polarization of the illumination light, whether the feature is above, below, to the left or right of the edge in question as well as for the particular kernel to be used.

For the example shown in FIG. 11B, the feature 192 has a horizontal edge 194 where the feature is located below the edge segment. Similarly, the horizontal edge 196 has the feature located above the edge fragment. As shown in FIG. 10B, the calculation of the image intensity for the horizontal edge 194 that is part of the feature 192 is performed by taking the values in the appropriate lookup table for the edge (2,3) and subtracting the values stored for the edge (2,1). Similarly, the contribution to the intensity due to the vertical edge 198 is computed by taking the values stored for the edge (2,1) in question minus 0 (because the edge (2,1) completely describes the edge 198). Similarly, the calculation done for the vertical edge 200 is performed by taking the values stored in the appropriate lookup table for the edge (1,2) minus 0 (again because the edge (1,2) describes the vertical edge 200 completely). Finally, the calculation done for the horizontal edge 196 is performed by taking the values stored in the appropriate lookup table for the edge (1,3) where the edge is below the feature in question minus the values stored in the lookup table for the edge (1,2). Again, the calculation shown in FIG. 10B is performed assuming a linear polarization of the illumination light in the x-direction (parallel to the horizontal edges). Next, a calculation is done whereby a Kirchhoff decomposition is performed that computes the contribution of the image intensity due to the areas of the feature(s) within the window of relevance assuming a linear polarization in the y-direction (that is parallel to the vertical edge segments) and a decomposition of the features into the horizontal, vertical and/or diagonal edges but using lookup tables that are computed for the edge segments assuming the y-direction polarization of light.

As with a conventional SOCS algorithm, the process is repeated using lookup tables populated with data for each kernel used in the calculation.

The following equations define how the partial results computed as shown in FIGS. 10A and 10B are combined to estimate the image intensity at the center of the window of relevance by:

$$i = (i_{xx} + i_{yy})/2 \quad \text{(Eq. 2)}$$

$$i_{xx}(x,y) \approx \Sigma i_{xxk}(x,y), \text{ where}$$
$$i_{xxk}(x,y) = \sigma_{xxk} |h_{xxk}(x,y) \otimes m_x(x,y)|^2 \quad \text{(Eq. 3)}$$

$$i_{yy}(x,y) \approx \Sigma i_{yyk}(x,y), \text{ where}$$
$$i_{yyk}(x,y) = \sigma_{yyk} |h_{yyk}(x,y) \otimes m_y(x,y)|^2 \quad \text{(Eq. 4)}$$

where i is the intensity in the window of relevance and $i_{xx}$ is the intensity due to the illuminative light that is linearly polarized parallel to the x direction in the window of relevance and $i_{yy}$ is the intensity due to the illumination light that is linearly polarized parallel to the y direction in the window of relevance, $m_x$ is the mask transmission function under linear-x polarization that includes the additional correction signals per edge as shown in FIGS. 11A and 11B and my is the mask transmission function under linear-y polarization that includes the additional correction signals per edge. The convolution products shown in Eq. 3 and Eq. 4 are evaluated using the lookup table framework of the SOCS method that is pictorially described in FIGS. 11A and 11B.

The convolution products that constitute the lookup tables (convolution of mask primitives with respective kernels) are best computed in the Fourier domain where the spectrum of the kernels and the spectrum of the primitive mask transmission function are utilized. Other ways can be used for the computation of such convolution products such as direct numerical computation of the convolution operation As can be seen, the present invention utilizes the SOCS algorithm to produce a more accurate estimate of the image intensity at any point on a wafer in a way that is not computationally intensive by utilizing lookup tables associated with each of the horizontal and vertical edge fragments of the feature within a window of relevance.

Although the present invention is shown and described with respect to edges in the window of relevance that are parallel and perpendicular, it will be appreciated that other edges can be calculated such as diagonal edges or, in general, edges of arbitrary orientation in the layout. Lookup tables for each edge orientation that is present in the layout can be created similarly according to the methodology shown in FIG. 8 or FIG. 9. The (i, j) position of each lookup table refers to the starting vertex of each edge and the other vertex always extends to the boundary of the window of relevance. Different lookup tables for linear x and linear y polarizations and for different kernels, different mask topographies and different relative positions of the edge with respect to the feature are created, similar to the procedure explained for horizontal and vertical edges as shown in FIGS. 8, 9 and 10. The additional signal of the sort shown in FIGS. 7A-7D that is needed for edges of arbitrary orientation can be synthesized by the signals shown in FIGS. 7A-7D because of the linearity of the electric field.

Figure 12:
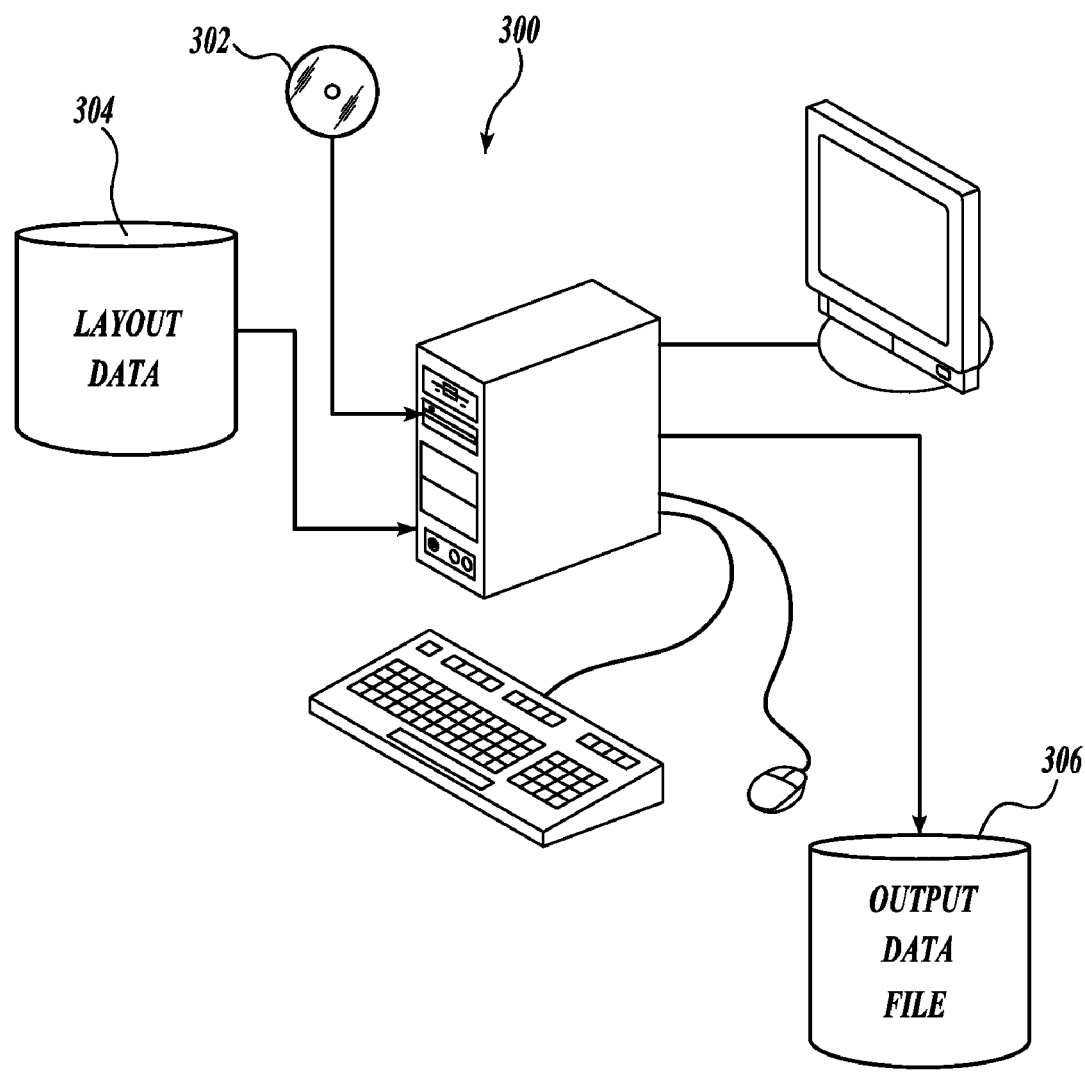
FIG. 12 illustrates an embodiment of a system for implementing the present invention.

FIG. 12 illustrates one embodiment of a system for implementing the present invention. A computer system 300 receives a set of executable instructions on a computer readable medium 302 such as a CD-ROM, DVD, floppy disk or over a network connection. The computer 300 executes the instructions to read a layout data file 304 that describes one or more layers of a device to be created and estimates the image intensity at various locations as described above. The instructions may be contained as a stand-alone program that produces a computer readable output file 306 of the computer image intensities for use by other programs. Alternatively, the instructions may be integrated into other verification and optimization programs for the addition of RETs to layout design, such that the output file 306 defines an RET corrected design that may be provided to a mask writer for use in a lithographic process.

The computer system 300 may be a stand-alone system of a distributed computer network. Furthermore, the computer system 300 may be located in another country and may transmit the file 306 into the United States or its territories.

Although the invention has been described as a technique for improving the computation time of intensities arising from 3D structures such as phase shifters on photomasks for the fabrication of integrated circuits, it will be appreciated that this may be useful for the fabrication of any device where these process distortions can be corrected using these techniques. These devices may include the photomask itself, integrated optical devices, micro-electromechanical systems (MEMS), optical recording and data storage devices, biochips, and any other application where fast and accurate computation of an image is needed.

While the preferred embodiment of the invention has been illustrated and described, it will be appreciated that various changes can be made therein without departing from the scope of the invention. It is therefore intended that the scope of the invention be determined from the following claims and equivalents thereof.

The invention claimed is:

1. A computer-implemented method for estimating image intensity expected on a wafer when the wafer is exposed to an image of a reticle or mask, the method comprising:
   dividing, by a computer, layout data for the reticle or mask into windows, wherein each window includes one or more features;
   determining, by the computer, an estimate of image intensity associated with the area of the features in at least one respective window by:
      applying a decomposition algorithm to the features in the respective window to define primitives representative of the area;
      for each primitive, accessing area lookup tables, each storing pre-calculated data for a convolution of a sum of coherent systems (SOCS) kernel and the primitive; and
      using the data from the area lookup tables to determine the estimate of the image intensity associated with the area of the features in the respective window;
   determining, by the computer, an estimate of image intensity associated with the edges of the features in the at least one respective window by:
      applying a decomposition algorithm to the features in the respective window to define a number of edge segments;
      for each edge segment, accessing edge lookup tables, each storing pre-calculated data for a convolution of a SOCS kernel and the edge segment; and
      using the pre-calculated data from the edge lookup tables to determine the estimate of the image intensity associated with the edges of the features in the respective window; and
   combining the estimate of the image intensity associated with the area of the features with the estimate of the image intensity associated with the edges of the features to determine an overall estimate of image intensity in the at least one respective window.

2. The method of claim 1, wherein the data in the edge lookup tables is pre-calculated assuming a polarized light.

3. The method of claim 1, wherein the data in the edge lookup tables is pre-calculated assuming an edge segment is below a feature or portion thereof.

4. The method of claim 1, wherein the data in the edge lookup tables is pre-calculated assuming an edge segment is above a feature or portion thereof.

5. The method of claim 1, wherein the data in the edge lookup tables is pre-calculated assuming an edge segment is to the left of a feature or portion thereof.

6. The method of claim 1, wherein the data in the edge lookup tables is pre-calculated assuming an edge segment is to the right of a feature or portion thereof.

7. A computer readable medium storing a sequence of instructions that are executable by a computer to perform the method of any of claims 1-6.

8. A file that can be read by a computer system that includes image intensities determined according to the method of any of claims 1-6.

9. A computer-implemented method for estimating image intensity expected on a wafer when the wafer is exposed to an image of a reticle or mask, the method comprising:
   determining, by a computer, an estimate of image intensity due to the area of features defined in a layout of the reticle or mask by:
      decomposing the features to define primitives representative of the area occupied by the features;
      for each primitive, accessing pre-calculated area data for a convolution of a sum of coherent systems (SOCS) kernel and the respective primitive; and
      using the pre-calculated area data to estimate the image intensity due to the area of the features;
   determining, by the computer, an estimate of image intensity due to the edges of the features defined in the layout by:
      decomposing the features to define a number of edge segments;
      for each edge segment, accessing pre-calculated edge data for a convolution of a SOCS kernel and the respective edge segment; and
      using the pre-calculated edge data to estimate the image intensity due to the edges of the features; and
   combining, by the computer, the estimate of image intensity due to the area of the features with the estimate of image intensity due to the edges of the features to determine an overall estimate of image intensity.

10. The method of claim 9, wherein the pre-calculated area data and the pre-calculated edge data are stored in lookup tables.

11. A computer readable medium storing a sequence of instructions that are executable by a computer to perform the method of any of claims 9-10.

* * * * *